United States Patent [19]

Huth et al.

[11] Patent Number: 5,434,752
[45] Date of Patent: Jul. 18, 1995

[54] SYSTEM AND METHOD FOR REGULATING STAGGERED CONNECTION INSERTION TIMING

[75] Inventors: Joseph D. Huth, Raleigh; Robert F. Pan, Apex; Frank J. Pita, Cary; Bart P. Reier; Victor E. Valle, both of Raleigh, all of N.C.

[73] Assignee: International Business Machines Corporation, Armonk, N.Y.

[21] Appl. No.: 144,172

[22] Filed: Oct. 27, 1993

[51] Int. Cl.⁶ .................... H05K 7/14; H01R 13/62
[52] U.S. Cl. .................... 361/798; 361/212; 361/220; 361/754; 361/733; 361/755; 361/786; 361/791; 361/801; 439/152; 439/157; 439/160
[58] Field of Search ............... 361/732, 733, 736, 740, 361/747, 752, 753, 754, 755, 759, 784, 786, 791, 796, 798, 799, 801, 212, 220; 439/152, 157, 160, 159, 924, 325, 327, 328, 345; 403/16, 321, 322, 325, 330; 307/43; 312/8, 332.1, 333; 206/387, 334, 328

[56] References Cited

U.S. PATENT DOCUMENTS

| | | | |
|---|---|---|---|
| 4,453,215 | 6/1984 | Reid | 364/200 |
| 4,486,826 | 12/1984 | Wolff et al. | 364/200 |
| 4,510,553 | 4/1985 | Faultersack | 361/786 |
| 4,579,406 | 4/1986 | Laursen et al. | 439/607 |
| 4,597,084 | 6/1986 | Dynneson et al. | 371/51 |
| 4,654,857 | 3/1987 | Samson et al. | 371/68 |
| 4,835,737 | 5/1989 | Herrig et al. | 364/900 |
| 4,848,944 | 7/1989 | Matsushita | 361/212 |
| 4,985,870 | 1/1991 | Faraci | 439/62 |

OTHER PUBLICATIONS

Research Disclosure "Dual-level Printed Circuit Board Edge Connector" No. 280 Aug. 1987.

*Primary Examiner*—Gerald P. Tolin
*Assistant Examiner*—Donald A. Sparks
*Attorney, Agent, or Firm*—Stephen T. Keohane

[57] ABSTRACT

A system for controlling staggered connection timing of an adapter module so that live insertion, or "hot swapping", may be performed with the adapter module, has a connector with staggered pins, i.e., some pins being longer than others for initial contact with mating pins of a mating connector. The system further has a latch for controlling the timing of the connection of the staggered pins. As an adapter module is inserted into a housing, the latch allows the adapter module to be in one of three positions: (1) an entirely disconnected position where none of the pins of the adapter module are connected to the pins of the housing connector; (2) a "stopped", or partially connected, position where the longer of the staggered pins are connected between the housing and adapter modules connectors; and (3) a "fully-engaged" position wherein all pins of the connectors are engaged. The latch and the pin lengths are designed so that upon the longer pins making mating contact, the latch momentarily forces the module into the stopped position thereby allowing any circuits on the adapter module or elsewhere in the housing to sufficiently pre-charge.

14 Claims, 4 Drawing Sheets

SYSTEM AND METHOD FOR REGULATING STAGGERED CONNECTION INSERTION TIMING

BACKGROUND OF THE INVENTION

I. Field of the Invention

The present invention relates to electronic systems having circuit boards installed therein and, more particularly, to a system and method for allowing live insertion of the circuit boards into the system by regulating staggered connection insertion timing of the boards.

II. Background and Prior Art

Given the increasing reliance on enterprise networking and online processing reliance, customers today are demanding maximum availability of electronic processing systems. It is therefore imperative that these electronic processing systems have as little "downtime", or time when the system is inoperable, as possible. The importance of minimum downtime is shown by the increasing popularity and demand of fault-tolerant systems, which are specifically designed to tolerate faults in the system (and even, in some cases, to detect and to correct its own faults) without having an outage.

However, the vast majority of system downtime (typically, from 70-90%) is not due to the whole system going down or "crashing" but rather is due to planned outages, or downtime which has been previously planned for problem diagnosis, part replacement, hardware reconfiguration and the like. Many times, a single adapter module (sometimes called "a card" or "a board") needs to be repaired or replaced for upgrade while the remainder of the system is operating properly. Shutting down an entire system for such routine service can impact a large number of users needlessly.

The preferred method of repairing or replacing a single module in a system is by live insertion/removal, or "hot-swapping", where the particular module is removed while the system remains powered up and otherwise functioning properly. Dynamic insertion and removal of adapter modules, if achieved non-disruptively, can allow major gains in overall system availability. Service diagnosis, corrective actions, and hardware reconfiguration can be performed seamlessly and in realtime.

In order to have live insertion/removal, the adapter modules and/or the system need to have specific circuitry or software for providing the live insertion/removal capability. When an unpowered module, without such capability, is inserted into a live, or powered, system, its insertion may cause voltage spikes to appear on data lines interconnected throughout the system. This is the result of the module's components receiving the power from the system and charging up for operation. These momentary spikes, or transients, can cause disruption of communications by corrupting the data flow between parties in the system. This disruption may be especially troublesome where there are many users in the system which are interconnected and communicating via an active bus.

There have been many attempts at providing reliable live insertion/removal capability. For instance, some systems use "umbilical cords" (or "cheater cords"), or cables providing power, attached to the modules to be inserted. The umbilical cords provide the necessary power to the module prior to the module's insertion and the module is allowed time to charge so that, when it is inserted, its components (or the "module load") have pre-charged and will not cause a spike to be transmitted on the system data lines. The problem is that this method of live insertion/removal is expensive given the cabling requirements, especially in high connectivity environments where a large number of high frequency cabling, such as coaxial cabling, is used. Further, the extra umbilical cabling is not user friendly as it is difficult and must be handled carefully due to safety concerns as the cord is powered.

A commonly assigned patent application, G. Hahn et al., "A Hot Pluggable Electrical Circuit", U.S. patent application Ser. No 08/003,074, filed Jan. 11, 1993 now pending, describes a circuit for minimizing the electrical transients resulting from insertion of an electrical circuit into a non-quiesced signal net by preconditioning signal net stub parasitics on the circuit being dynamically live inserted. However, this implementation must be such that stable pre-charge can be guaranteed before the inserted feature contacts the live parallel bus. This entails the completion of power-up, voltage stabilization, and time to fully charge stub parasitics. If enough time is not allowed so that stable pre-charge can be assured, then feature insertion will likely corrupt the information being transferred between parties on an active parallel bus.

Other systems provide a current-limiting circuit on the module, through which the module load is initially charged before supplying the module load with power directly. This is implemented, for example, using field-effect transistors (FETs) such as metal oxide semiconductor (MOS) FETs, in conjunction with "sequential" connectors. A sequential connector is one in which certain pins of the connector are staggered with respect to the remainder of the pins so as to make or break an electrical connection before other pins of the connector. Normally, in such systems, the connection sequence is such that the first to connect is the module ground and the board ground, then to connect the board voltage supply to the current limiter on the module, and finally to connect the voltage supply to the module load directly.

While such systems are capable of providing live insertion, several problems remain. First, there is the obvious expense of providing a separate current-limiting circuit on each module which may plug into a system. Second, such systems are susceptible to high-frequency noise resulting from parasitic oscillations occurring when the drain pin of the system is joined to the module. This connection typically produces an inrush of current into the card to charge the MOSFET's parametric capacitance, typically about 3,000 pF.

Some of these problems are solved by a system described another commonly assigned patent application, P. Bellamy et al., "Sequential Connector", Ser. No. 07/661,283 now U.S. Pat. No. 5,268,592. In this system, staggered connections are used to enable a current limiting power MOSFET so that the module's power supply is slowly charged up. As in other staggered connection systems, the P. Bellamy et al. connector provides some pins on either the module connector or on its mating system connector which are slightly longer than others so that the longer ones make initial contact. This allows the electrical signals conveyed by the longer pins to flow between the module and the system before those conveyed by the shorter ones.

The problem is that the amount of time between the initial contact of the longer pins (and thus initial current flow) and the subsequent contact of the shorter pins (and subsequent current flow) is a short period time—as an installer is moving the module with sufficient force and speed so that its connector may become properly seated with the mating connector. Thus, the time allowed for load pre-charge is merely the amount of time it takes the connector to sweep across the long pins prior to contacting the shorter pins. This amount of time may or may not be sufficient for the load pre-charge.

An additional problem is that this amount of time will vary from installer to installer as each installer may install a module differently than the next installer. As a module normally slides freely on guiding tracks or rails within a system, the insertion speed of the module is not inhibited in any way with the exception of the insertion force required by the module and system connectors. This force is easily overcome by an installer so that race conditions result in that there is a race between the load pre-charge and voltage stabilization and the engagement of the shorter pins. There is no practical way of controlling the time, or guaranteeing a consistently minimum time, between the initial contact of the longer pins and the subsequent contact of the shorter pins as each installer will perform the same function in a different manner causing different results.

If not enough time is provided between the initial contact of the longer pins and the subsequent contact of the shorter pins, communication disruption will occur—especially where the insertion is into an active parallel bus as transients will corrupt data flowing between parties in the system.

SUMMARY OF THE INVENTION

A system for controlling staggered connection timing of an adapter module so that live insertion, or "hot swapping", may be performed with the adapter module, has a connector with staggered pins, i.e., some pins being longer than others for initial contact with mating pins of a mating connector. The system further has a latch for controlling the timing of the connection of the staggered pins. As an adapter module is inserted into a housing, the latch allows the adapter module to be in one of three positions: (1) an entirely disconnected position where none of the pins of the adapter module are connected to the pins of the housing connector; (2) a "stopped", or partially connected, position where the longer of the staggered pins are connected between the housing and adapter modules connectors; and (3) a "fully-engaged" position wherein all pins of the connectors are engaged. The latch and the pin lengths are designed so that upon the longer pins making mating contact, the latch momentarily forces the module into the stopped position thereby allowing any circuits on the adapter module or elsewhere in the housing to sufficiently pre-charge.

BRIEF DESCRIPTION OF THE DRAWINGS

While the technical description concludes with claims particularly pointing out and distinctly claiming that which is regarded as the invention, details of a preferred embodiment of the invention may be more readily ascertained from the following technical description when read in conjunction with the accompanying drawings, where:

DETAILED DESCRIPTION OF THE PREFERRED EMBODIMENT

Figure 1:
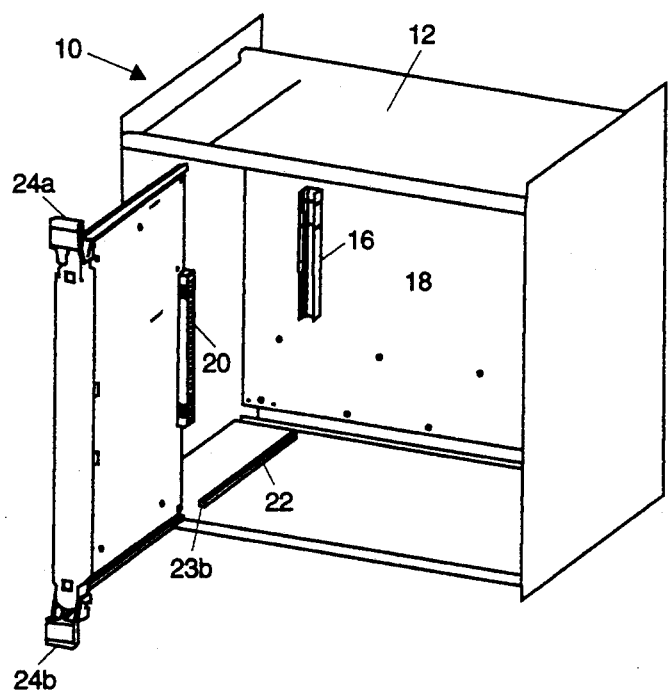
FIG. 1 is a perspective view illustrating the system of the present invention wherein an adapter module is shown removed from a housing.

Referring first to FIG. 1, the system 10 of the present invention is shown. System 10 comprises a housing 12 into which one or more adapter modules 14 (one shown in an exploded view) may be inserted and plugged in. Connectors 16 (one shown) mounted on a backplane 18 of housing 12 are selected so that each connector 16 mates with a corresponding connector 20 mounted on the adapter module 14. Housing 12 provides the mechanical structure for receiving the adapter modules as well as providing cooling (via fans and ventilation) and power to the modules. In addition, housing 12 normally provides a backplane bus so that inserted adapter modules may communicate with one another and with the housing itself, if the housing has processing ability.

The housing, in this example, is shown to be merely a module cage, just a skeleton for receiving the adapter modules, providing the mechanical structure, cooling and power to the modules as well as providing a data bus so that the various adapter modules may communicate with one another. Housings, however, may be quite complex, such as where the housing is a personal computer housing, an intelligent hub housing or a router housing. In these products, the housings themselves have a significant amount of processing ability, in addition to providing the power and cooling needs of the adapter modules.

As was discussed, a number of adapter modules may be inserted by sliding the modules into the housing 12 and connected with backplane connectors 16 of the housing 12. Various types of adapter modules may be utilized with a housing, depending upon the user's requirements. For instance, if the housing supports receiving four adapter modules (as limited by the number of adapter module slots, for instance), the user may decide to install two token-ring local area network (LAN) adapter modules for providing token-ring LAN workstation support, an Ethernet LAN adapter module for providing Ethernet LAN workstation support, and an 8 MB expansion memory board for expanding the random access memory (RAM) of the system. If the user's requirements change, the user may remove one of the adapter modules and replace it with another providing the necessary function.

Adapter module 14 slides into housing 12 and is guided into place by top and bottom module tracks 22 (only bottom module track shown). An installation bar 23a, 23b (only bottom installation bar 23b shown) at the front end of each track 22 are used along with top and bottom latches 24a and 24b mounted on the adapter module 14 to complete the insertion of the module into the housing 12 as will be discussed in further detail below.

Figure 2:
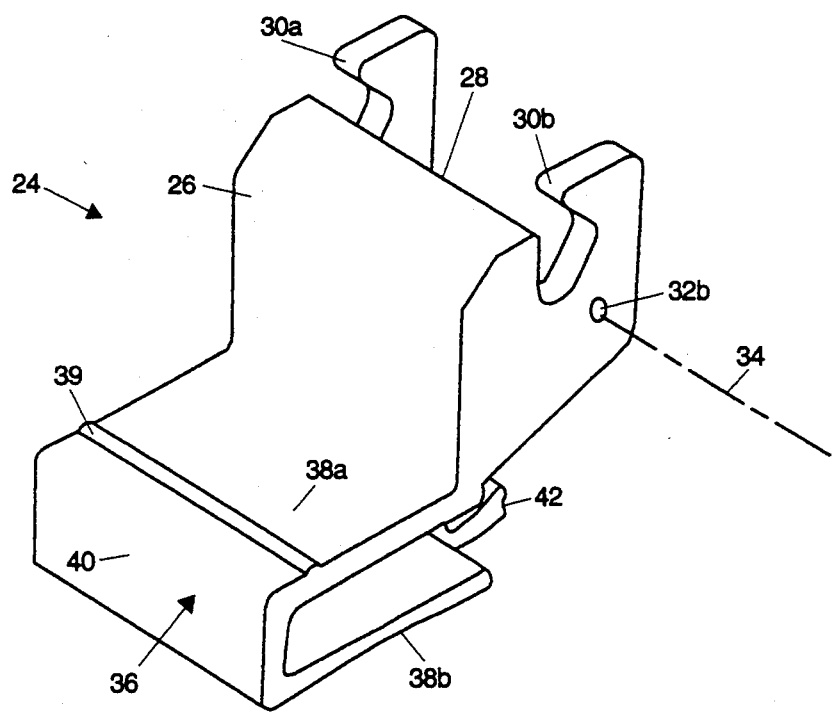
FIG. 2 is a perspective view of the latch of the present invention.

FIG. 2 illustrates a perspective view of a latch 24 of the present invention. Latch 24, which is mounted to an adapter module by a roll pin, has an upper body 26 comprising an extraction lever 28, two insertion levers 30a, 30b, and two roll pin apertures 32a, 32b (only 32b shown) in the two insertion levers 30a, 30b. The insertion levers 30a, 30b extend outwardly in a parallel manner from the upper body 26. Roll pin apertures 32a, 32b are located in insertion levers 30a, 30b such that they form a roll pin axis 34 around which the latch 24 may rotate when properly mounted to an adapter module by a roll pin. Roll pin axis 34 is perpendicular to parallel insertion levers 30a, 30b.

Latch 24 further consists of an actuator 36 comprising an upper and a lower portion 38a, 38b. Upper portion 38a, which has a grip 39, and lower portion 38b are substantially parallel with one another so that they may be easily gripped by the fingers of a user. Actuator 36 further has an end portion 40 connected between the upper and lower portions 38a, 38b. End portion 40 and upper and lower portions 38a, 38b are flexible enough so that a user may be able to squeeze with his/her fingers and thumb upper and lower portions 38a, 38b towards one another so that the lower portion 38b moves toward upper portion 38a but not so flexible that upper and lower portions 38a, 38b may be easily compressed together. A stop member 42 extends outwardly from the end of lower portion 38b.

Figure 3:
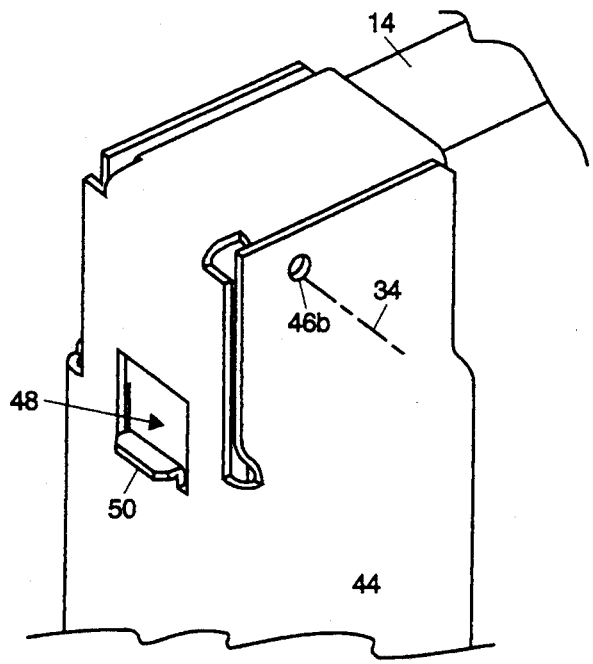
FIG. 3 is a perspective view of the top portion of a bracket which is mounted upon the end of an adapter module of the present invention.

FIG. 3 illustrates a top end portion of an adapter module 14, the top end portion being shown without a latch attached. As can be seen, the adapter module 14 has a bracket 44 attached along its end, the bracket 44 having a number of apertures extending therethrough. At the top, front portion of the bracket 44, there are two roll pin apertures 46a, 46b (roll pin aperture 46a being hidden from view). Roll pin apertures 46a, 46b correspond with roll pin apertures 32a, 32b of the latch 24, thereby forming the same roll pin axis 34 of the latch of FIG. 2. It is through these roll pin apertures 46a, 46b, along with roll pin apertures 32a, 32b, that a roll pin is inserted for holding a latch 24 in place when it is mounted onto the module 14. The mounted latch is rotatable around the roll pin axis 34.

Bracket 44 further has a stop member receiving aperture 48 positioned along the front side of the bracket 44. Stop member receiving aperture 48 is positioned and dimensioned for receiving the stop member 42 of latch 24 (as shown in FIG. 2) when the upper and lower portions 38a, 38b of actuator 36 are squeezed together by a user. Along the bottom of stop member receiving aperture 48 is a stop member block 50, which protrudes slightly upward into stop member receiving aperture 48 and slightly outward from bracket 44. Stop member block 50 is positioned and dimensioned for blocking stop member 42 from being inserted into stop member receiving aperture 48 when upper and lower portions 38a, 38b of actuator 36 are not squeezed together.

Figure 4:
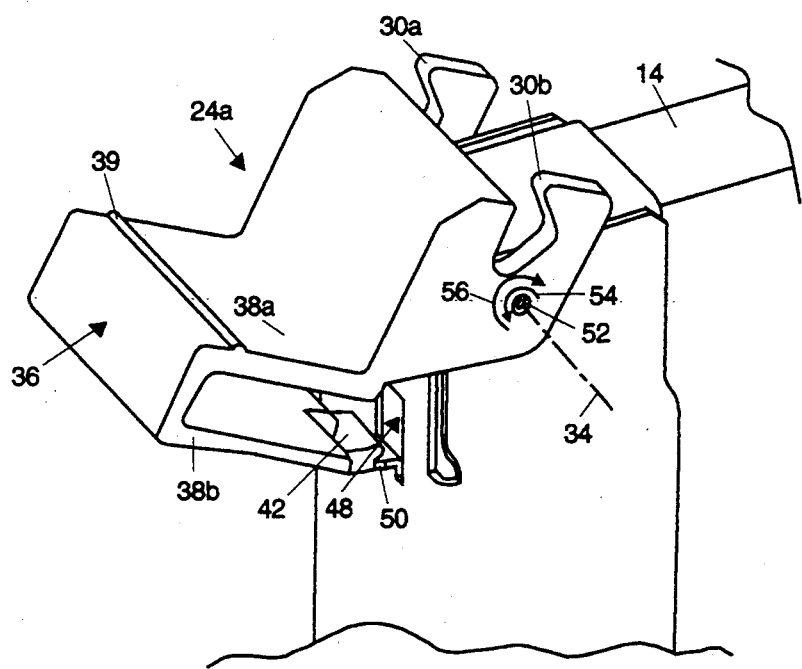
FIG. 4 is a perspective view of the latch mounted to the top portion of the bracket of the present invention.

FIG. 4 shows, in a perspective view, a latch 24a properly mounted to an adapter module 14 by a roll pin 52. The roll pin 52 holds the latch 24a to the adapter module 14 in such a way so that the latch 24a may partially rotate around roll pin axis 34. This partial rotation is shown by arrows 54, 56. The rotation of the latch 24a about axis 34 assists in inserting the adapter module 14 into a housing (by latch rotation direction 54) and in removing the adapter module 14 from the housing (by latch rotation direction 56). As can be seen, when upper and lower portions 38a, 38b of actuator 36 are not squeezed together by a user, stop member 42 rests against stop member block 50 so that stop member 42 is not able to be inserted into stop member receiving aperture 48. This is the latch's "stopped" position.

Figure 5A:
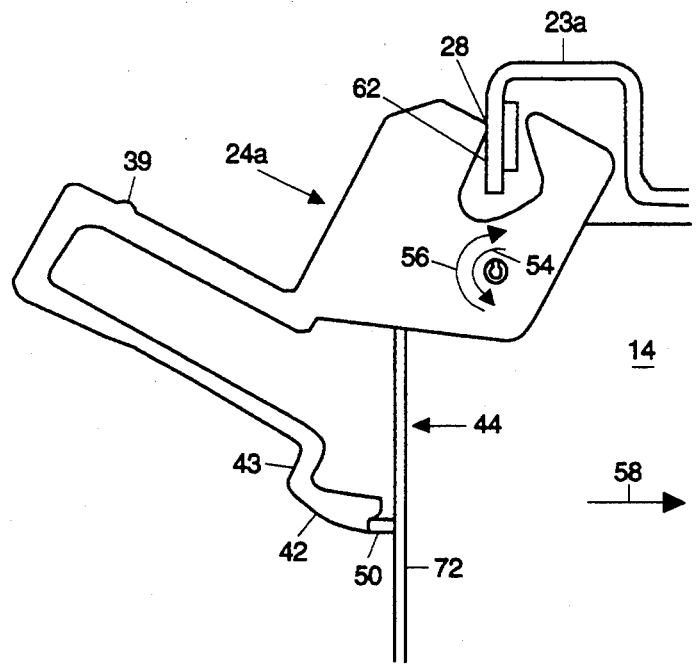
FIGS. 5A and 5B illustrate, from a side view, the engagement of the latch of the present invention when the adapter module is moved from a "stopped" position to a "fully-engaged" position.
Figure 5B:
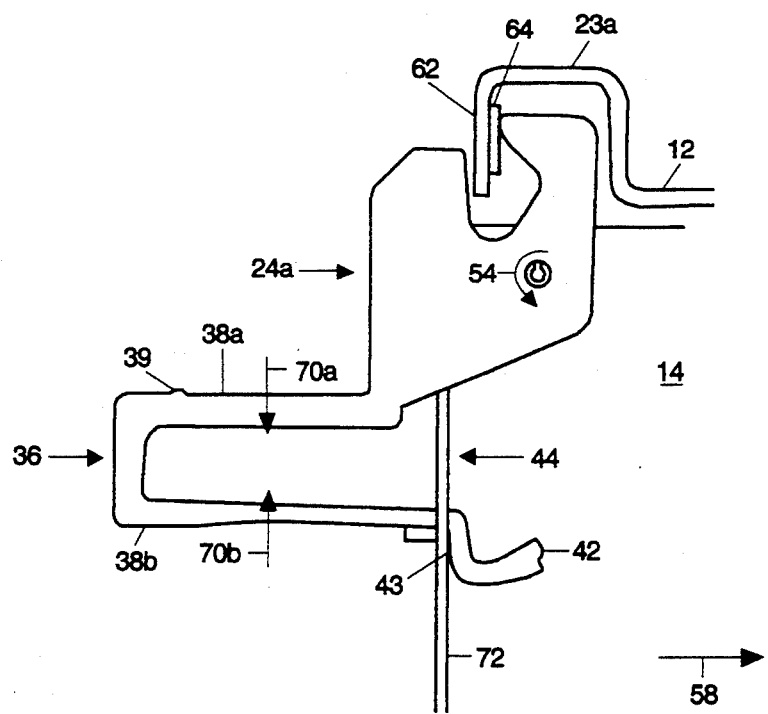

FIGS. 5A and 5B illustrate in a side view the latch 24a, mounted to an adapter module 14 which is being inserted into a housing 12, in the adapter module's "stopped" position (FIG. 5A) and in its "fully-engaged" position (FIG. 5B). Referring first to FIG. 5A, the adapter module 14 is being inserted into a housing 12 in the direction as indicated by arrow 58. The housing installation bar 23a which is U-shaped is utilized for assisting in the insertion and removal of adapter modules from the housing. Housing 12 has a corresponding installation bar 23b along the bottom for engaging a latch 24b mounted at the bottom of the adapter module 14. Each "slot" for receiving an adapter module of the housing has a pair of such installation bars.

As the adapter module 14 is inserted in to the housing 12 in direction 58, the latch extraction lever 28 engages the installation bar 23a at front portion 62. (The latch insertion levers 30a, 30b must first clear the installation bar 23a. This is accomplished by rotating (partially) the latch 24a in direction 56 enough so that insertion levers 30a, 30b clear beneath the installation bar 23a.) As extraction lever 28 engages the installation bar 23a upon insertion of module in direction 58, the latch 24a naturally rotates in direction 54 until stop member 42 engages stop member block 50 of bracket 44. In this stopped position, the adapter module is partially connected into the system 10, that is, its connector 20 is partially, but not fully, seated with the mating housing connector 16 of the housing 12.

Figure 6:
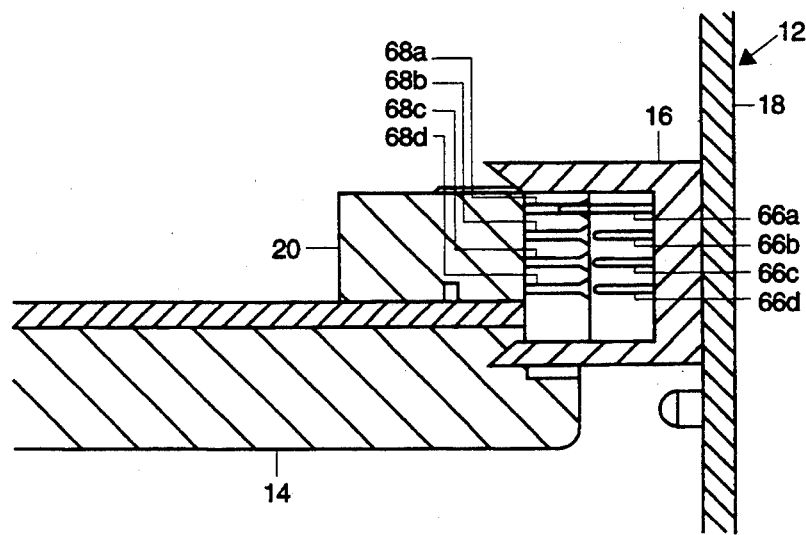
FIG. 6 illustrates, from a side view in partial cross-section, the adapter module connector and pins in partial engagement with the housing connector and pins.

FIG. 6, which is a side view in partial cross-section, illustrates the respective positions of the adapter module connector 20 and the housing connector 16 when the adapter module 14 is in the stopped position. As can be seen in the figure, housing connector 16, mounted to backplane 18, has a number of conductive pins, four in this example, 66a, 66b, 66c, and 66d. These conductive pins convey the electrical signals between the housing 12 and the adapter module 14. These pins have different lengths from one another. In this example, pin 66a is the longest among the pins while pins 66b, 66c and 66d are shorter than pin 66a but are the same length as one another. Because pin 66a is the longest, it extends outwardly from connector 16 (and backplane 18) the furthest as compared to pins 66b, 66c and 66d.

Adapter module connector 20 also has a number of conductive pins 68a, 68b, 68c, 68d for conveying electrical signals between the adapter module 14 and the housing 12. Conductive pins 68a, 68b, 68c, 68d are positioned and dimensioned to receive and mate with conductive pins 66a, 66b, 66c, 66d of the backplane connector 16. The conductive pins of the adapter module connector and of the housing connector correspond with one another and for pin pairs 66a/68a, 66b/68b, 66c/68c and 66d/68d. It should be noted that, in this example, the pins of the housing connector are staggered rather than the pins of the adapter module but the module pins (or both the housing and module pins) could be staggered just as easily.

As FIG. 6 illustrates the respective position of the adapter module connector 20 and housing connector 16 when the adapter module is in a stopped position, adapter module connector 20 is not fully engaged with housing connector 16 so that all the conductive pin pairs are not connected. Because pin 66a extends outwardly from the backplane 18, it makes initial contact and engagement with pin 68a of adapter module connector 20. The electrical signals which are to be conveyed via pin pair 66a/68a can be conveyed between the adapter module and the system. The remaining pins 66b, 66c, 66d, however, do not extend outwardly far enough to make contact with their mating pins (68b, 68c, 68d) when the adapter module is in the stopped position. Thus, the electrical signals to be conveyed via pin pairs 66b/68b, 66c/68c, 66d/68d between the adapter module and the system cannot be conveyed until the connectors (20 and 16) are fully engaged.

Referring again to FIGS. 5A and 5B, the engagement of the adapter module from the stopped to the fully-engaged position is shown. As was discussed, FIG. 5A illustrates the adapter module in the stopped position wherein the adapter module connector is partially engaged with the housing connector (16 and 20 in FIG. 6, respectively) so that only some pin pairs of the connectors are engaged (pin pair 66a/68a of FIG. 6). Stop member 42 and extraction lever of latch 24a and installation bar 42 of the housing prevent the adapter module from being fully inserted into the housing. The user, however, may fully insert the adapter module by squeezing (with his/her fingers and thumb) upper and power portions 38a, 38b of actuator 36 in the direction of arrows 70a, 70b and simultaneously rotating the latch 24a in the direction of arrow 54 as shown in FIG. 5B. This action causes two things to happen. First, by squeezing upper and lower portions 38a, 38b, stop member 42 is caused to move in the direction of arrow 70b relative to stop member block 50. This allows the stop member 42 to clear the stop member block 50 and to be inserted in stop member receiving aperture (48 in FIGS. 3 and 4). Second, by rotating the latch in the direction of arrow 54, insertion levers 30a, 30b engage installation bar back portion 64 causing the adapter module to be inserted into the housing in the direction of arrow 58. The latch and the connectors (16 and 20) are dimensioned so that when the connectors are fully engaged, i.e., all of the pin pairs are matingly engaged and providing a conductive path between the adapter module and the housing, the latch is in the fully-engaged position of FIG. 5B where the stop member has passed through the stop member receiving aperture and a stop member lock 43 has engaged the inner wall 72 of the bracket 44 so that the adapter module cannot work its way out of the fully-engaged position (due to physical system movement, for instance).

Thus, it can be seen that the system of the present invention allows live insertion of electrical modules into active processing systems by providing reliable and predictable control of the timing between sequenced connections. This is accomplished through the unique utilization of a latch in conjunction with staggered pins wherein the latch provides a controlled stop during insertion so that some of the staggered connections are made while others remain unengaged. The latch is then used as a lever for assisting in the engagement of the remainder of the pins. This combination provides a reliable and predictable minimum time between staggered connections so that proper pre-charge and voltage stabilization may be accomplished so that no disruption occurs within the system due to the live insertion. While the invention has been particularly shown and described with reference to preferred embodiments thereof, it will be understood by those skilled in the art that various other changes in form and detail may be made without departing from the spirit and scope of the invention.

What is claimed is:

1. A system for allowing live insertion of electronic modules comprising:
   at least one module having a connector at one end for being inserted into said system;
   a housing for receiving said module in a partially inserted position and further for receiving said module in a fully inserted position, said housing having at least one connector mounted thereto for mating with said module connector;
   said housing connector and said module connector each having a plurality of contacts for conveying electrical signals therethrough, said housing connector contacts corresponding with said module connector contacts, said corresponding contacts of said module connector and of said housing connector forming contact pairs for engaging one another, said contact pairs comprising a first set of contact pairs for being engaged when said module is in said partially inserted position and for being engaged when said module is in said fully inserted position and a second set of contact pairs for being engaged only when said module is in said fully inserted position; and
   latching means connected to said module for controlling the position of said module in said housing comprising means for stopping said module in said partially inserted position as said module is being inserted into said housing, and means for moving said module to said fully inserted position.

2. The system defined in claim 1 wherein said module further comprises a blocking element on a side opposite said module connector and further wherein said latching means comprises a latch rotatably mounted to said module, said latch having a stop member for engaging said blocking element when said module is in said partially inserted position.

3. The system defined in claim 2 wherein said latch further comprises an actuator, connected to said stop member, for moving said module from said partially inserted position to said fully inserted position.

4. The system defined in claims 2 or 3 wherein module further comprises a stop member receiving aperture positioned adjacent to said blocking element for receiving said stop member when said module is in said fully inserted position.

5. The system defined in claims 2 or 3 wherein said housing further comprises an installation bar for assisting the stopping of said module in said partially inserted position and further wherein said latch further comprises an extraction lever for engaging said installation bar when said module is in said partially inserted position.

6. The system defined in claim 5 wherein said latch further comprises at least one insertion lever for assisting the installation of said module into said fully inserted position, said at least one insertion lever being positioned for engaging said installation bar when said module is being moved from said partially inserted position to said fully inserted position.

7. An electronic module for being inserted into a system without removing the power from said system, said system having a connector for receiving said module in a partially inserted position and further for receiving said module in a fully inserted position, said system connector having a plurality of contacts for conveying electrical signals therethrough, said module comprising:
 a connector at one end for mating with said system connector;
 said module connector a plurality of contacts corresponding with said system connector contacts, said corresponding contacts of said module connector and of said system connector forming pairs for engaging one another, said contact pairs comprising a first set of contact pairs for being engaged when said module is in said partially inserted position and for being engaged when said module is in said fully inserted position and a second set of contact pairs for being engaged only when said module is in said fully inserted position; and
 latching means connected to said module for controlling the position of said module in said housing comprising means for stopping said module in said partially inserted position as said module is being inserted into said housing, and means for moving said module to said fully inserted position.

8. The module defined in claim 7 further comprising a blocking element on a side opposite said module connector and further wherein said latching means comprises a latch rotatably mounted to said module, said latch having a stop member for engaging said blocking element when said module is in said partially inserted position.

9. The module defined in claim 8 wherein said latch further comprises an actuator, connected to said stop member, for moving said module from said partially inserted position to said fully inserted position.

10. The module defined in claims 8 or 9 further comprising a stop member receiving aperture positioned adjacent to said blocking element for receiving said stop member when said module is in said fully inserted position.

11. The module defined in claims 8 or 9 wherein said system further comprises an installation bar for assisting the stopping of said module in said partially inserted position and further wherein said latch further comprises an extraction lever for engaging said installation bar when said module is in said partially inserted position.

12. The module defined in claim 11 wherein said latch further comprises at least one insertion lever for assisting the installation of said module into said fully inserted position, said at least one insertion lever being positioned for engaging said installation bar when said module is being moved from said partially inserted position to said fully inserted position.

13. A computer adapter module for communicating with a computer bus and for engaging a computer bus connector having a plurality of contacts, the adapter module comprising:
 staggered connection means including a first set of contacts for electronically communicating bus signals between the adapter module and the computer bus, and further including a second set of contacts for supplying power and ground to the adapter module from the computer bus, the first and second sets of contacts being positioned for engaging the computer bus contacts, the second set of contacts positioned with respect to the first set so that the second set engage first in time when the adapter module is being engaged with the computer bus connector; and
 latching means comprising:
 a face member having an opening therein;
 a latch rotatably mounted to the adapter module having a stop member protruding therefrom, the stop member being movable with respect to the face member between a stopping position and a clearing position, the latch being mounted so that it can be rotated during insertion of the adapter module into the computer bus connector only until the stop member engages the face member such that only the second set of contacts is engaged, the latch being further mounted so that the stop member may be moved to the clearing position and the latch can continue to be rotated so that the stop member passes through the opening and the adapter module completely inserted so that both first and second sets of contacts are engaged.

14. The module defined in claim 13 wherein the latch further comprises an actuator, connected to the stop member, for moving the stop member from the stopping to the clearing position.

* * * * *